United States Patent
Nesemann (10) Patent No.: US 11,183,967 B2
(45) Date of Patent: Nov. 23, 2021

(54) ISOLATING APPARATUS FOR A PHOTOVOLTAIC STRING

(71) Applicant: SMA Solar Technology AG, Niestetal (DE)

(72) Inventor: Karl Nesemann, Kaufungen (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 16/277,323

(22) Filed: Feb. 15, 2019

(65) Prior Publication Data

US 2019/0181800 A1    Jun. 13, 2019

Related U.S. Application Data

(63) Continuation of application No. PCT/EP2017/068638, filed on Jul. 24, 2017.

(30) Foreign Application Priority Data

Aug. 17, 2016  (DE) .................. 10 2016 115 295.1

(51) Int. Cl.

| | |
|---|---|
| *H02S 40/36* | (2014.01) |
| *H02S 40/32* | (2014.01) |
| *H02J 3/38* | (2006.01) |
| *H01L 31/02* | (2006.01) |
| *H02S 50/10* | (2014.01) |
| *H02S 50/00* | (2014.01) |

(52) U.S. Cl.
CPC ........ *H02S 40/36* (2014.12); *H01L 31/02021* (2013.01); *H02J 3/383* (2013.01); *H02S 40/32* (2014.12); *H02S 50/00* (2013.01); *H02S 50/10* (2014.12); *Y02E 10/56* (2013.01)

(58) Field of Classification Search
CPC .......... H02S 40/36; H02S 40/32; H02S 50/10; H02S 50/10; H01L 31/02021; H02J 3/383
See application file for complete search history.

(56) References Cited

U.S. PATENT DOCUMENTS

| | | |
|---|---|---|
| 2003/0011348 A1 | 1/2003 | Lof et al. |
| 2009/0032082 A1 | 2/2009 | Gilmore et al. |
| | (Continued) | |

FOREIGN PATENT DOCUMENTS

| | | |
|---|---|---|
| CN | 104218609 A | 12/2014 |
| CN | 105548755 A | 5/2016 |
| JP | 0870533 A | 3/1996 |

OTHER PUBLICATIONS

Marston, FET Principles and Circuits—Part 1, Nuts & Volts Magazine, pp. 1-12 (Year: 2000).*

(Continued)

*Primary Examiner* — Jayne L Mershon
(74) *Attorney, Agent, or Firm* — Eschweiler & Potashnik, LLC (57) ABSTRACT

An apparatus for electrically disconnecting a first part from a second part of a photovoltaic string, which parts can be connected to a first terminal and a second terminal of the apparatus, respectively. The apparatus includes a switch coupled between the first terminal and the second terminal; and an actuation apparatus configured to open the switch when a voltage applied to at least one of the first and second terminals relative to a potential applied to a reference terminal is outside of a prescribed value range.

10 Claims, 6 Drawing Sheets

(56) References Cited

U.S. PATENT DOCUMENTS

| | | |
|---|---|---|
| 2010/0019754 A1 | 1/2010 | Schreiber |
| 2011/0031813 A1 | 2/2011 | Falk |
| 2011/0068633 A1 | 3/2011 | Quardt et al. |
| 2011/0079263 A1* | 4/2011 | Avrutsky ............... H02J 7/35 |
| | | 136/244 |
| 2012/0050924 A1 | 3/2012 | Matsuo |
| 2012/0163048 A1 | 6/2012 | Victor |
| 2013/0057989 A1 | 3/2013 | Victor et al. |
| 2013/0058140 A1 | 3/2013 | Victor |
| 2013/0099571 A1 | 4/2013 | Bremicker et al. |
| 2013/0194706 A1* | 8/2013 | Har-Shai ............... H02J 1/00 |
| | | 361/42 |
| 2014/0253138 A1* | 9/2014 | Ishii ............... H02S 50/10 |
| | | 324/509 |

OTHER PUBLICATIONS

Kumar, MOSFET Transistor: Easiest Basics, Operation and Types, Analyse A Meter, pp. 1-9 (Year: 2016).*

Herd, How CMOS Works: MOSFETS, JFETS, IGFETS, and More, Hackaday, pp. 1-9 (Year: 2015).*

International Search Report dated Sep. 25, 2017 in connection with International Application PCT/EP2017068638.

* cited by examiner

ISOLATING APPARATUS FOR A PHOTOVOLTAIC STRING

CROSS REFERENCE TO RELATED APPLICATIONS

This application is a continuation of International Patent Application number PCT/EP2017/068638, filed on Jul. 24, 2017, which claims priority to German Patent Application number 202016115295.1, filed on Aug. 17, 2016, and is hereby incorporated by reference in its entirety.

FIELD

The disclosure relates to an disconnecting apparatus for a photovoltaic string, and to an energy generation installation having such an disconnecting apparatus.

BACKGROUND

In order to design photovoltaic energy generation installations in a cost-effective manner, it is desirable to connect the solar modules used to form series circuits, so-called strings, as long as possible in order to achieve the highest possible string voltage. However, at the same time, a high string voltage involves the risk of generating high fault currents in the event of isolation faults within the energy generation installation, which fault currents can damage installation components. Furthermore, isolation faults can lead to parts of the energy generation installation having a potential with respect to ground potential that is outside of safety standards. It is therefore necessary to secure photovoltaic energy generation installations against isolation faults.

Document US 2009 0032082 A1 discloses providing a string with a remotely controlled switch in the middle of the string, which switch separates the string into two parts in the event of a fault. The remote control system is arranged in or on the inverter and opens the switch when the string does not deliver any power, in order to prevent a violation of maximum values of the voltage within the string with respect to ground potential. The remote control system of the switch in the middle of the string requires additional outlay due to additional cable connections within the energy generation installation.

Document EP 2 296 244 A1 discloses a photovoltaic installation, in which a grounding at the connecting point between two partial strings is separated together jointly with the connection of the partial strings when a current flowing to ground exceeds a limit value. As long as the limit value is not reached, the string is effectively grounded at the connecting point.

SUMMARY

The present disclosure demonstrates a switch within a string of a photovoltaic energy generation installation. The switch automatically separates the string into partial strings in the event of isolation faults, without requiring external actuation and without prescribing low-impedance grounding of the string.

An apparatus according to the disclosure for electrically isolating a first part and a second part of a photovoltaic string, which parts can be connected to a first terminal and a second terminal of the apparatus, comprises a switch and an actuation apparatus configured therefore. The actuation apparatus is configured to open the switch when a voltage applied to at least one of the terminals relative to a potential applied to a reference terminal is outside of a prescribed value range. In one embodiment, the reference terminal is connected to ground potential, in particular the switch is opened when the voltage applied to at least one of the terminals deviates from the ground potential by a prescribed magnitude.

In this case, the disconnecting apparatus should not have any influence or should have only the lowest possible influence on the voltage applied to the terminals. To guarantee this, a measurement impedance between the first or second terminal and the reference terminal should be as high as possible, for example, above 10 kOhm, or above 100 kOhm.

In one embodiment, the switch is formed by a series circuit composed of two semiconductor switches. In one embodiment the switch or the switches comprise normally on switches so that the electrical connection between the first and the second terminal is closed when the active actuation of the switch by way of the actuation apparatus is omitted. This configuration of switches facilitates start-up, for example, at dawn, since the string is already connected when the solar modules begin to produce power.

One advantageous refinement makes provision for the first and the second switch to be FETs (field-effect transistors). Particularly suitable here in one embodiment are JFETs (junction FETs), wherein, in particular, the first switch is an n-channel JFET and the second switch is a p-channel JFET. In this configuration, the actuation voltages for the first and second switch can easily be generated by way of a suitably dimensioned network composed of passive components, for example a resistive voltage divider, between the first terminal, the second terminal and the reference terminal as actuation apparatus. As an alternative, other switches, in particular other semiconductor switches, can also be used and two switches of the same channel type (n-channel or p-channel switches) can also be combined and optionally likewise actuated by way of an adapted network composed of passive components.

In one embodiment, the apparatus is configured to generate a fault signal when the switch or switches is/are opened. This fault signal can be transmitted wirelessly or by wire to a superordinate operating unit, which reacts to the fault signal in a suitable manner.

The actuation apparatus can in turn furthermore be configured to open the switch or switches when a corresponding signal to open the switches is received. The corresponding signal can also be received wirelessly or by wire.

In one embodiment, the actuation apparatus can furthermore be configured to close the switch or switches again after opening when at least one of the following criteria is met:

A magnitude of the difference between ground potential and a mean voltage value at the first and the second terminal is below a prescribed threshold value. This is the case, for example, when the photovoltaic string is no longer illuminated at night.

A prescribed time period has passed since the opening. This does not preclude that, shortly after the switch has been closed, it is again determined that the condition for opening the switch is still present so that the switch is immediately opened again. It is conceivable for only a limited number of attempts to close the switch again to be provided and, after the corresponding number of failed attempts, for renewed closing to take place only on account of the other mentioned criteria.

An external signal for closing is received. This signal can be transmitted, for example, by a superordinate operating unit wirelessly or by wire.

By providing a criterion for renewed closing of the switches, the time period in which the photovoltaic string does not deliver any power on account of the open switch is kept low, since, after the necessity to open the switch is no longer present, said switch can be immediately closed again.

In a further embodiment, the actuation apparatus can be connected to an energy store, for example a battery or a capacitor, for the purpose of electrical power supply. In this case, the charging of the energy store can be configured from a voltage dropped across the switch or switches. If the voltage dropped across the switch or switches in the closed state is insufficient to charge the energy store, it is conceivable that at least one of the switches is opened temporarily or transferred to a partially conducting operation, in order to increase the voltage dropped across the switch or switches to a voltage value sufficient for the charging.

A further aspect of the disclosure relates to a photovoltaic energy generation installation having a first and a second inverter connected in series on the input side, that is to say on the DC side. A midpoint of the series circuit of the inverters is connected to an isolation monitoring means (e.g., circuitry) and thereby in a switchable manner to a reference-ground potential, for example, ground potential. As an alternative, a photovoltaic energy generation installation according to the disclosure can also have an individual inverter having a split input-side link circuit, wherein a midpoint of the split link circuit is connected to ground potential by means of the isolation monitoring means.

On the DC side, in one embodiment the inverter or the inverters is/are connected to at least one photovoltaic string, which has an apparatus according to the disclosure. If the photovoltaic energy generation installation comprises a plurality of parallel-connected photovoltaic strings, each of said strings is advantageously provided with a respective apparatus according to one embodiment of the disclosure. In one embodiment, the apparatus according to the disclosure is arranged in each case in the middle of the photovoltaic string, as a result of which the first and second parts of the string that are connected to the apparatus have the same number of solar modules and the same nominal string voltage, and are connected to ground potential by means of the reference terminal.

In one embodiment, the string has a maximum open circuit voltage of more than 1500 V. By using the disconnecting apparatus, it is possible, even given a high string voltage, to guarantee that maximum voltage values of the string with respect to ground potential are still observed even in the event of a ground fault, which leads to triggering of an isolation monitoring means and hence disconnection of a grounding connection of the string or of the photovoltaic energy generation installation. The disconnection of the grounding connection leads to a shift in the potential of the string with respect to ground so that a sufficiently large shift in said potential leads to opening of the disconnecting apparatus according to the disclosure in the affected string.

BRIEF DESCRIPTION OF THE DRAWINGS

The following text illustrates the disclosure with the aid of figures, in which.

DETAILED DESCRIPTION

Figure 1:
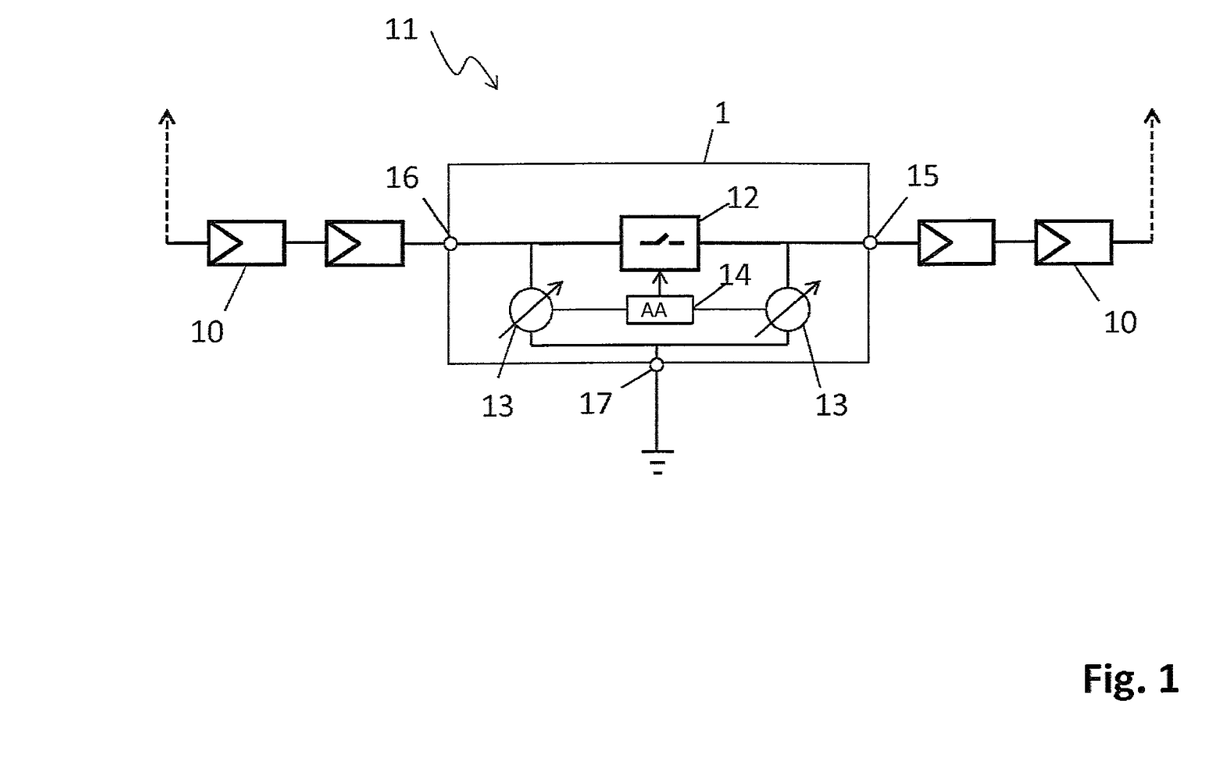
FIG. 1 shows a first embodiment of an disconnecting apparatus.

FIG. 1 shows a photovoltaic string 11 having a series circuit composed of solar modules 10. A first partial string of the string 11 is connected to a terminal 15 and a second partial string of the string 11 is connected to a terminal 16 of an disconnecting apparatus 1 so that a load path, which carries the power generated in the string, runs via the disconnecting apparatus 1. Within the disconnecting apparatus 1, a switch 12 is arranged between the load-carrying terminals 15, 16 so that said switch can disconnect the load path in a controlled manner. The switch 12 is connected to an actuation apparatus (AA) 14 for this purpose. The actuation apparatus 14 is connected to at least one voltmeter or voltage detection circuit 13, which determines a voltage between one of the terminals 15, 16 and a further terminal 17, which can be connected to ground potential. In one embodiment, two voltmeters 13 are provided and connected to the actuation apparatus 14, which two voltmeters are each connected to one of the terminals 15, 16.

The actuation apparatus 14 is configured in such a way that it controls the switch 12 depending on the measured voltage value or the measured voltage values of the connected voltmeter or voltmeters 13. The switch 12 is kept in a closed state by the actuation apparatus 14 as long as the measured voltage magnitude does not exceed a predetermined first limit value; otherwise the switch 12 is opened by the actuation apparatus 13 and the load path of the string 11 is disconnected.

In one embodiment the disconnecting apparatus 1 is located in the middle of the string 11, that is to say partial strings of equal length are connected to the two terminals 15, 16. In the event of the two ends of the string 11 having a voltage distribution that is symmetrical with respect to ground potential, a potential that is equal to or close to the ground potential is produced at the closed switch 12 when the two partial strings are irradiated equally. When the partial strings are irradiated unequally or when there is an isolation fault in one of the partial strings, a shift in the switch potential is produced, which is identified by the voltmeter 13 and, given a sufficient level, determined by the first limit value, leads to opening of the power path of the string 11. In one embodiment, no external signal is required for this; the disconnecting apparatus 1 monitors the string 11 autonomously.

Figure 2A:
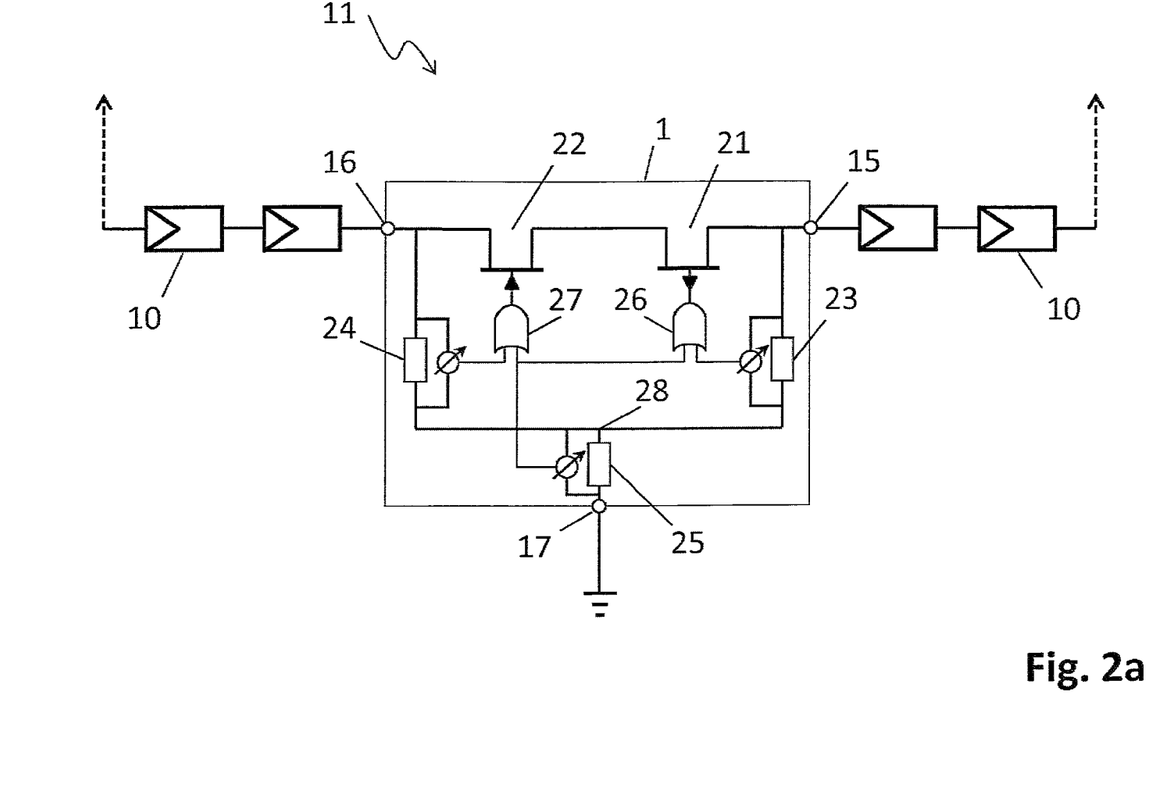
FIG. 2a shows a second embodiment of an disconnecting apparatus comprising two semiconductor switches.

FIG. 2a shows one embodiment of the disclosure in which the switch of the disconnecting apparatus 1 is formed by a series circuit composed of a first and a second semiconductor switch 21, 22. The first semiconductor switch 21 comprises a p-channel field-effect transistor (p-FET) and the second semiconductor switch 22 comprises an n-channel field-effect transistor (n-FET). The two semiconductor switches 21, 22 are, in one embodiment, provided as normally on type semiconductor switches.

The two partial string terminals 15, 16 and the further terminal 17 are each connected to a common connecting point by means of suitably selected first, second and third resistors 23, 24, 25 so that said terminals form a voltage divider. The voltage values dropped at the resistors 23, 24, 25 are detected by means of respective voltmeters 13. In one embodiment the voltmeters 13 compare the measured voltage values with stored limit values and output the result of the comparison by means of a comparison signal, for example, a digital comparison signal. The comparison signal of the voltmeter 13 at the first resistor 23 is transmitted to a first gate input of a first gate 26, the comparison signal of the voltmeter 13 at the second resistor 24 is transmitted to a first gate input of a second gate 27 and the comparison signal of the voltmeter 13 at the third resistor 25 is transmitted to each of a second gate input of the first gate 26 and of the second gate 27. The gate output of the first gate actuates the first semiconductor switch 21 and the gate output of the second gate actuates the second semiconductor switch 22.

The first resistor 23 and the second resistor 24 are, in one embodiment, selected with the same value and identical limit values are stored in the voltmeters 13 associated therewith. In order to keep an influence on the voltage at the terminals 15, 16 as low as possible, the resistance values of the resistors 23, 24, 25 may be selected to be as high as possible, for example, the total resistance of the resistor network is not less than 10 kOhm in one embodiment.

In one embodiment the actuation apparatus 14 is supplied with power by means of the voltage drop across the switch 12 or one or both semiconductor switches 21, 22, so that an additional power supply is not needed. Since the voltage drop in the closed state of said switch or switches is regularly too low to supply power, provision can be made for said switch or switches to be opened temporarily by the actuation apparatus 14, in order to recharge an energy store, for example a capacitor, supplying power to the actuation apparatus 14, when the state of charge thereof has fallen below a prescribed level. Instead of completely opening the switch or switches, it is also possible to temporarily transfer it/them to a partially conducting state in which a voltage drop across the switch or switches that is sufficient for recharging is achieved.

Figure 2B:
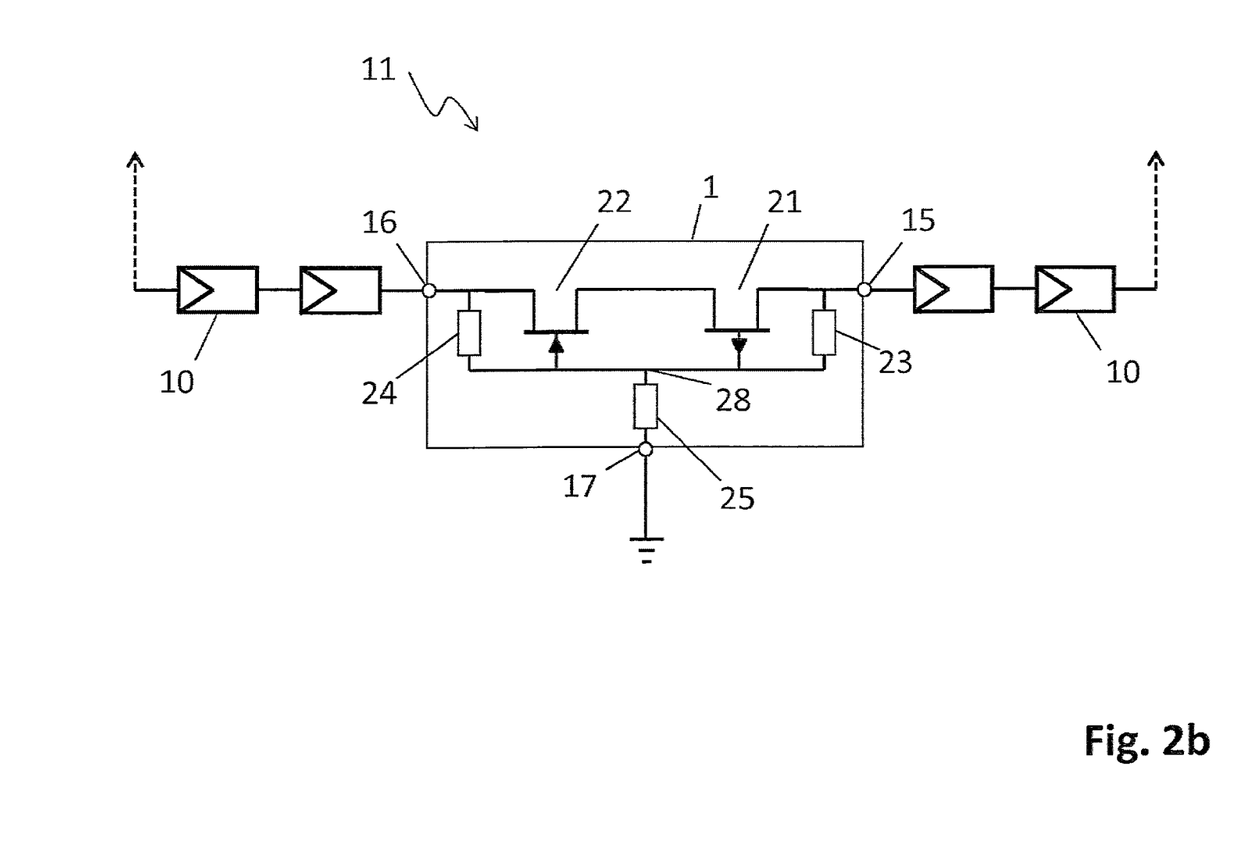
FIG. 2b shows a third embodiment of an disconnecting apparatus in a passive design.

FIG. 2b shows an embodiment that manages without such an energy supply. Instead of voltmeters 13 and gates 26, 27, only the resistor network of the first, second and third resistors 23, 24, 25 already shown in FIG. 2a is present here. The voltage divider formed by said resistors directly generates the control voltages required to actuate the semiconductor switches 21, 22 by virtue of the respective gate terminals of the semiconductor switches 21, 22 being connected to the common connecting point of the voltage divider. As a result, the need to supply power to the actuation circuit is eliminated since this consists only of passive components in this example. Of course, further passive components, for example capacitors, arranged in parallel with the resistors 23, 24, 25, are conceivable. As a result, in particular, a time delay of the actuation of the semiconductor switches 21, 22 can be realized in order to make the disconnecting apparatus 1 insensitive with respect to short term voltage fluctuations. Other arrangements of resistive or capacitive voltage dividers between the terminals 15, 16 and 17 are also conceivable in order to define the respective limit values, upon the reaching of which the semiconductor switches 21, 22 are intended to be opened or closed, or in order to achieve desired triggering dynamics of the disconnecting apparatus 1.

Figure 3:
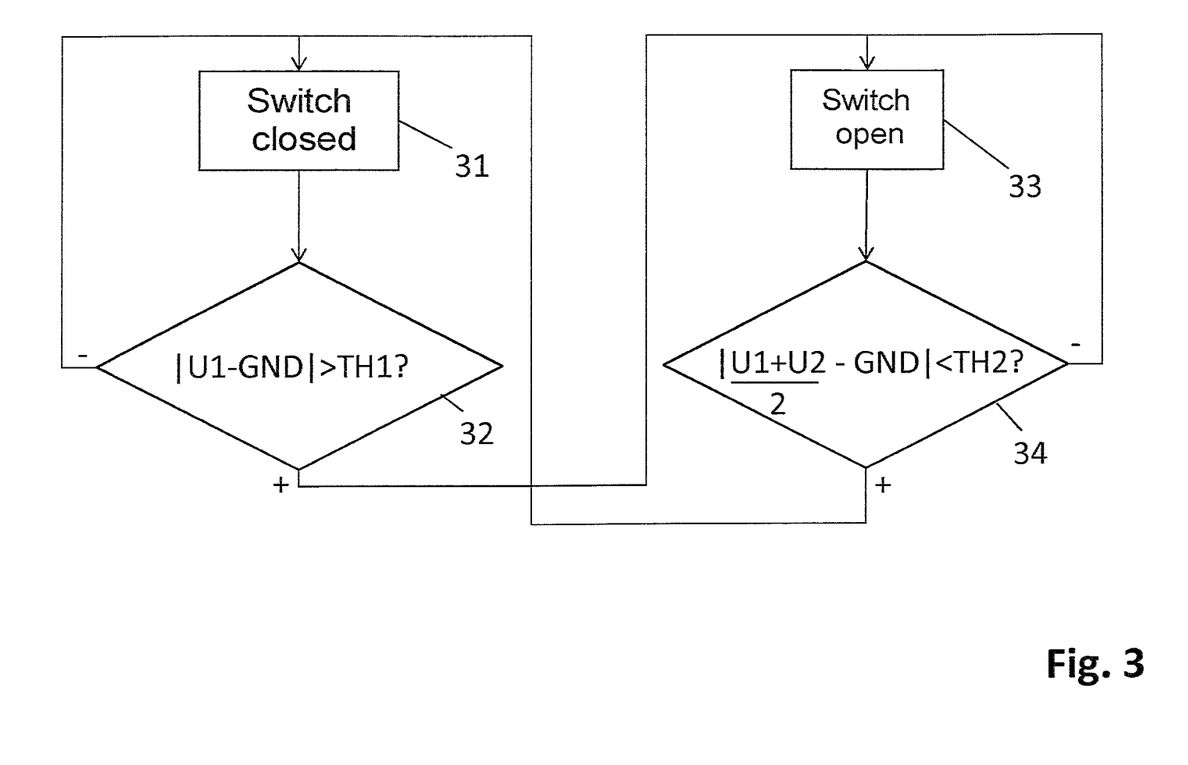
FIG. 3 shows a flow chart of a method according to the disclosure.

FIG. 3 illustrates a method for operating the disconnecting apparatus 1 as a flow chart. Proceeding from act 31, in which the switch 12 or the two semiconductor switches 21, 22 are in a closed state or are closed, it is determined in act 32 whether the magnitude of the voltage U1 at one of the terminals 15, 16 deviates from the ground potential GND, measured at terminal 17, by more than a first limit value TH1. If this is not the case, the method is branched back to act 31.

If the magnitude of the deviation exceeds the first limit value TH1, there is a branch off to act 33 and the switch 12 or at least one of the switches 21, 22 is opened, as a result of which the load path between the terminals 15 and 16 is disconnected. This interrupts the string current via the disconnecting apparatus 1 and an open circuit voltage is produced at the connected solar modules 10. This leads to a voltage difference U1-U2 between the terminals 15 and 16.

In order to reverse the disconnection of the load path again, act 34 then checks to determine whether the magnitude of a mean value (U1+U2)/2 of the voltages at the terminals 15 and 16 (without restricting the generality, in the following text, the voltage U1 should be dropped at the terminal 15 and the voltage U2 should be dropped at the terminal 16) deviates from ground potential GND by less than a second limit value TH2. If the deviation is lower than the second limit value TH2, there is a branch off to act 31 and the switch 12 or the switches 21 and 22 are closed, as a result of which the load path between the terminals 15 and 16 is re-established. Otherwise, the method returns to act 33 and the switch 12 or the semiconductor switches 21, 22 remain open.

In a modification of the described method, instead of act 34, the switch 12 or the two semiconductor switches 21, 22 are temporarily closed after a prescribed time delay and there is branch off to act 32, in which it is then determined whether the switch or switches can remain closed (branching to act 31) or have to be opened again (branching to act 33). As an alternative, the switch 12 or the two semiconductor switches 21, 22 can be closed due to the reception of an external signal.

Figure 4:
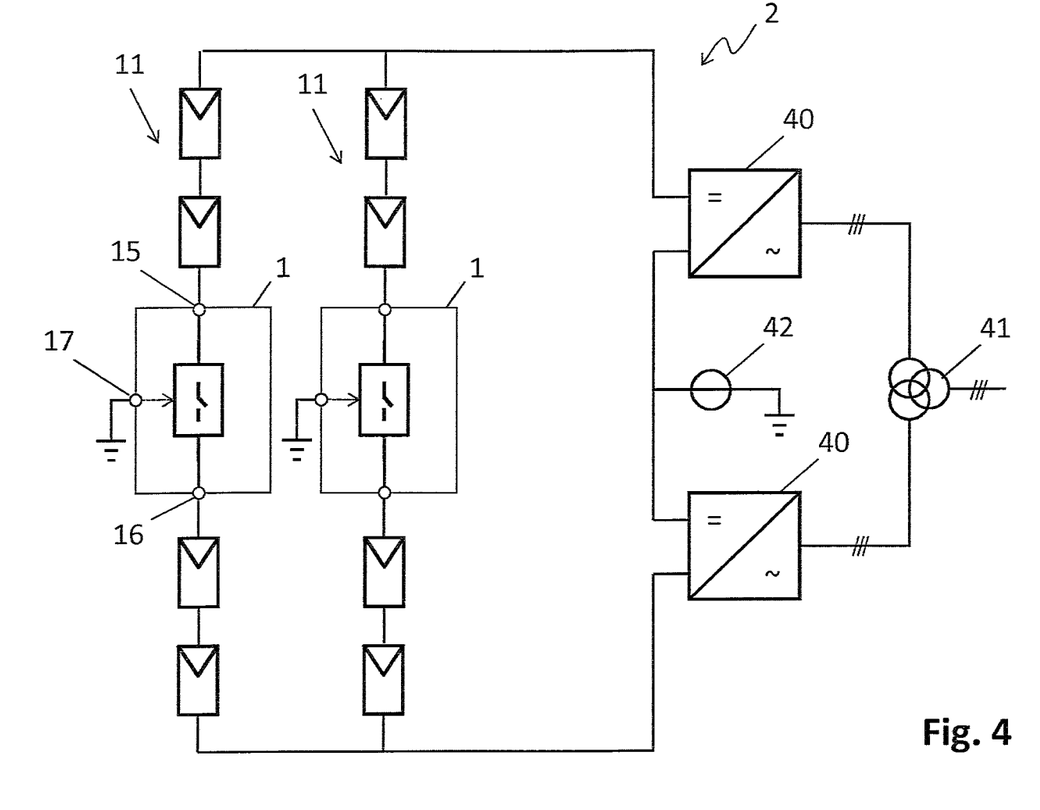
FIG. 4 shows a first energy generation installation comprising disconnecting apparatuses according to the disclosure and FIG. 5 shows a second energy generation installation comprising disconnecting apparatuses according to the disclosure.

FIG. 4 shows an energy generation installation 2 according to the disclosure, in which the disconnecting apparatus 1 described above is integrated. A plurality of strings 11 having solar modules 10 are connected in parallel in this installation and have a respective disconnecting apparatus 1 in the middle of the strings 11. The terminal lines of the strings 11 are each connected to one of two inverters 40 connected in series on the DC side. The connecting line between the two inverters 40 is connected to ground potential by means of an isolation monitoring means 42. On the AC side, the two inverters 40 are connected to seperate primary windings of a common transformer 41. The secondary winding of the transformer 41 is connected to an energy supply grid. The inverters are, in one embodiment, three-phase inverters. The energy supply grid can advantageously be a medium-voltage grid.

During operation, in one embodiment, an isolation monitoring means or circuit 42 guarantees that the potential between the inverters corresponds to ground potential. Given an equal DC input voltage of the two inverters 40, this produces a symmetrical voltage distribution of the string ends with respect to ground potential, which in turn leads during normal operation to the potential in the middle of the string corresponding to ground potential. As a result, the switches in the disconnecting apparatuses 1 and hence the load path of the strings are closed in normal operation and the string current can flow unhindered.

In the event of an isolation fault, the isolation monitoring means 42 determines a direct current flowing with respect to the ground potential. If the magnitude of the direct current exceeds a prescribed maximum value, in one example of an operating method, the isolation monitoring means isolates the connection to the ground potential, as a result of which the potential between the inverters is no longer kept at ground potential. In this case, the isolation fault, in particular the location of the isolation fault, determines the potential forming in the middle of the string. In general, said potential will deviate from the ground potential in such a way that the first limit value TH1 is exceeded and the disconnecting apparatus 1 opens. This occurs in all of the disconnecting apparatuses of the energy generation installation 2 independently of one another and in an analogous manner. Even if the isolation fault is located in one of the strings 11 having a disconnecting apparatus 1, the isolation fault is not eliminated by opening said disconnecting apparatus. It should be emphasized here that, in the event of an isolation fault, the voltages U1, U2 at the terminals 15 and 16 of an open disconnecting apparatus 1 are not distributed symmetrically with respect to the ground potential, that is to say the mean value of the voltages U1 and U2 deviates from the ground potential by more than the second limit value TH2. Therefore, the result of act 34 of the operating method described above prevents the renewed closing of the switch 12 or of the semiconductor switches 21, 22 as long as the isolation fault is in effect.

There is a comparable behavior when the two partial strings of a string 11 are irradiated with a different light intensity, in particular when a partial string is in shadow with respect to the other partial string. In this case, a voltage U1 deviating from the ground potential is likewise produced at the terminal 15 of the disconnecting apparatus 1 of said string 11, and the disconnecting apparatus disconnects the load path. As a result, the two partial strings go into the open circuit state, as a result of which different open circuit voltages are dropped at said partial strings as long as the state of different irradiation of the partial strings lasts. Since the string ends furthermore have a symmetrical voltage distribution with respect to ground potential, the mean value of the voltages U1 and U2 at the terminals 15 and 16 of the open disconnecting apparatus 1 also deviate here from ground potential. However, when the two partial strings are irradiated evenly again at a later time and their open circuit voltages correspond to the extent that the condition at act 34 is met, and the disconnecting apparatus 1 closes the load path independently so that the string 11 produces power again.

The likelihood of an uneven irradiation of partial strings of a string 11 leading to disconnection of the load path can be minimized by way of an arrangement of the solar modules 10 of the partial strings, in which arrangement the solar modules 10 of the one partial string are placed as close as possible to the solar modules 10 of the other partial string. For example, the two partial strings can run in parallel directly next to one another and in this case possibly change the side with respect to one another multiple times so that a profile interwoven with one another is produced. As a result, a shadowing object or a shadowing event affects the solar modules 10 of the two partial strings in a similar manner.

Figure 5:
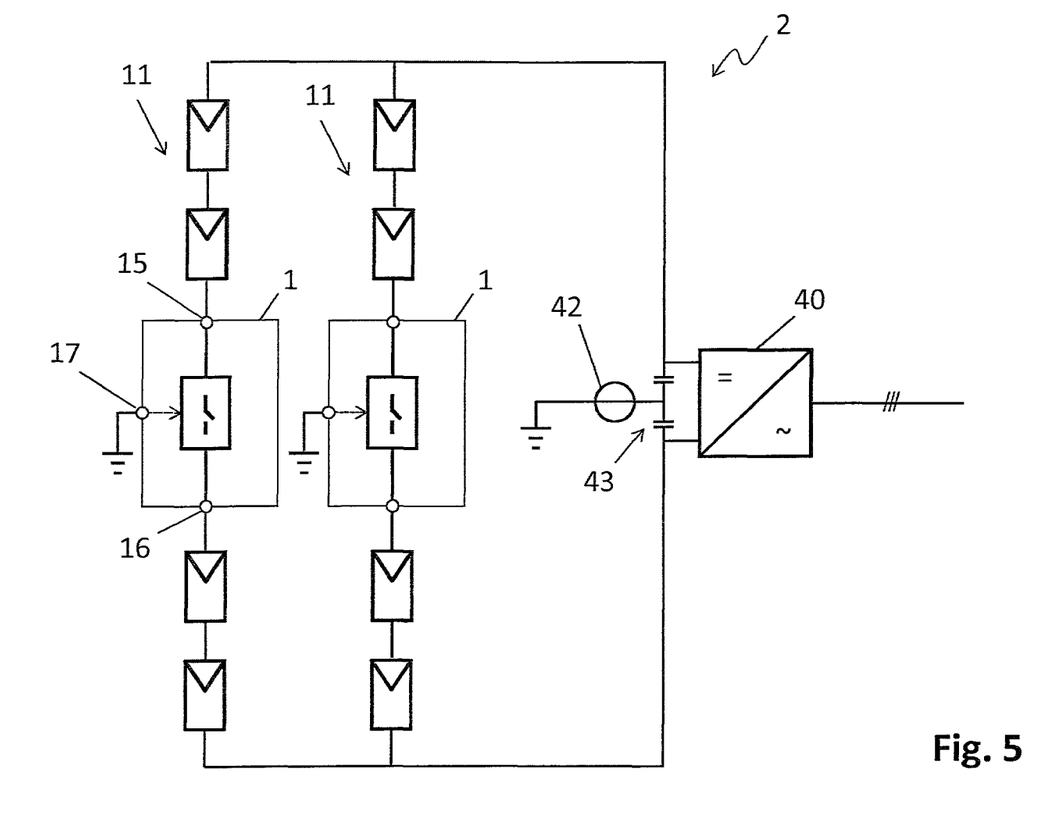

In the embodiment of a photovoltaic energy generation installation 2 according to FIG. 5, only one individual inverter 40 is used. In this case, the isolation monitoring means or circuit 42 is connected to a midpoint of an input-side link circuit 43. In this arrangement, the inverter 40 has to be dimensioned to the total string voltage as permissible input voltage. Otherwise, the operation of this installation corresponds to that said in connection with the energy generation installation 2 of FIG. 4.

The invention claimed is:

1. An apparatus for electrically disconnecting a first part from a second part of a photovoltaic string that are connected electrically in series with one another, which parts can be connected to a first terminal and a second terminal of the apparatus, respectively, wherein the apparatus comprises:
a switch coupled between the first terminal and the second terminal; and
an actuation apparatus configured to open the switch in response to a ground fault detection when a voltage applied to at least one of the first and second terminals relative to a potential applied to a reference terminal is outside of a prescribed value range, wherein upon the switch being opened by the actuation apparatus, a current conducting between the first and second parts of the photovoltaic string is interrupted.

2. The apparatus as claimed in claim 1, wherein the switch comprises a series circuit composed of two semiconductor switches.

3. The apparatus as claimed in claim 2, wherein the first switch and the second switch are normally on type switches.

4. The apparatus as claimed in claim 3, wherein the first switch and the second switch comprise JFETs.

5. The apparatus as claimed in claim 4, wherein the first switch is a p-JFET and the second switch is an n-JFET.

6. The apparatus as claimed in claim 1, wherein a measurement impedance between one of the first and second terminals and the reference terminal is at least 10 kOhm.

7. The apparatus as claimed in claim 1, wherein the actuation apparatus is configured to generate a fault signal when the switch is opened.

8. The apparatus as claimed in claim 1, wherein the actuation apparatus is further configured to open the switch when an external signal is received.

9. The apparatus as claimed in claim 1, wherein the actuation apparatus is further configured to close the switch again after opening when at least one of the following criteria is met:
a magnitude of the difference between the ground potential and a mean voltage value at the first terminal and the second terminal is below a prescribed threshold value,
a prescribed time period has passed since the opening of the switch, and
an external signal for closing the switch is received.

10. The apparatus as claimed in claim 1, wherein the actuation apparatus is connected to an energy store for the purpose of electrical power supply, wherein the energy store is configured to charge from a voltage dropped across the switch.

* * * * *